(12) United States Patent
Avinoam et al.

(10) Patent No.: US 6,614,321 B2
(45) Date of Patent: Sep. 2, 2003

(54) ATOMIC FREQUENCY STANDARD AND SYSTEM HAVING IMPROVED LONG TERM AGING

(75) Inventors: Stern Avinoam, Jerusalem (IL); Levy Benny, Jerusalem (IL)

(73) Assignee: AccuBeat Ltd., Jerusalem (IL)

( * ) Notice: Subject to any disclaimer, the term of this patent is extended or adjusted under 35 U.S.C. 154(b) by 4 days.

(21) Appl. No.: 10/067,147

(22) Filed: Feb. 4, 2002

(65) Prior Publication Data

US 2003/0146798 A1 Aug. 7, 2003

(51) Int. Cl.[7] .................................................. H01S 1/06
(52) U.S. Cl. ............................................. 331/94.1; 331/3
(58) Field of Search ..................................... 331/3, 94.1

(56) References Cited

U.S. PATENT DOCUMENTS

| | | | | |
|---|---|---|---|---|
| 4,740,761 A | * | 4/1988 | Barnes et al. ................. | 331/3 |
| 4,899,117 A | * | 2/1990 | Vig ................................ | 331/3 |
| 5,673,006 A | * | 9/1997 | Reinhardt ...................... | 331/3 |
| 6,130,583 A | * | 10/2000 | Stern et al. .................... | 331/3 |

* cited by examiner

Primary Examiner—Timothy P. Callahan
Assistant Examiner—Cassandra Cox
(74) Attorney, Agent, or Firm—Katten Muchin Zavis Rosenman

(57) ABSTRACT

An atomic frequency standard system includes two atomic standard devices, a comparison circuit and a correction circuit. The first device operates continuously, while the second device is operated only periodically. As the second device is only periodically operated, it experiences little frequency drift due to aging effects. When operated, the second device is stabilized, and then frequency compared to the first device by means of the comparison circuit. The correction circuit is then used to recalibrate frequency of the first device with the stabilized frequency of the second device.

16 Claims, 2 Drawing Sheets

ATOMIC FREQUENCY STANDARD AND SYSTEM HAVING IMPROVED LONG TERM AGING

FIELD OF THE INVENTION

The present invention relates to the field of atomic frequency standards that experience an aging phenomenon, i.e., their output frequency drifts with the passage of time. More specifically, the present invention relates to an atomic frequency standard and system having improved long term aging. In general terms, this is accomplished by adding at least one additional atomic resonator within an atomic frequency standard or by adding at least one additional small atomic standard coupled to a main small atomic standard.

BACKGROUND OF THE INVENTION

An atomic frequency standard such as Rubidium Frequency Standard, or small Cesium Frequency Standard (vapor cell), relies on an electromagnetic radiation that is emitted or absorbed by an atom when it is making a transition between two energy states (which is called "the clock transition"). However, since the atoms in small atomic standards, such as Rubidium, are not completely free, they experience collisions with the container wall (glass cell), with a buffer gas atoms, or they interact with the light that "pumps" the atoms. For example, the atoms in a Rubidium Standard are in a vapor state, inside a glass cell and kept at temperature around 80–120° C. As a result, the clock.transition frequency is shifted slightly and the amount of shift changes with the passage of time. The change of frequency with time due to internal processes in the device is called "aging". Such internal processes may be due to the diffusion of atoms, slow chemical reactions, or other.

For example, a Rubidium Frequency Standard device, exhibits an aging ranging between $1 \times 10^{-11}$/month to $4 \times 10^{-11}$/month.

An atomic frequency standard usually comprises of an Atomic Resonator, (called Physics-Package) which contains the atoms, and a crystal oscillator (usually an OCXO) which is frequency locked to the atomic resonator, via a Frequency Lock Loop (FLL).

Some atomic clocks use a digital FLL where a microprocessor is embedded within the FLL. Such an FLL (which is used by model AR-40A manufactured by AccuBeat Ltd.) is shown in FIG. 1.

In the atomic frequency standard shown in FIG. 1, a Voltage Controlled Crystal Oscillator (VCXO) (1), outputs a 10 MHz signal. This signal is used for the output of the device and also for the internal FLL. Within the FLL the 10 MHz signal is being multiplied by 684 to get 6.84 GHz. A Direct Digital Synthesizer (DDS) (3), produces an adjustable frequency around 5.3 MHz. The difference 6.84 GHz–5.3 MHz is aimed at the rubidium clock transition frequency. This difference is injected into the atomic resonator (which in the Rubidium case, is called the "physics package") (5). The atomic resonator (5), which contains rubidium vapor cells, acts as a discriminator, i.e., it produces an error signal which is proportional to the deviation of the injected frequency (i.e., 6.8 GHz–5.3 MHz) from the rubidium clock transition frequency. This error signal is read by the microprocessor (4), which controls the VCXO (1) and locks its frequency to the rubidium clock transition frequency.

There are two ways to tune the frequency of the device:
a. Tune the current in a magnetic coil around the rubidium vapor cell inside the resonator. This will change the magnetic field around the atoms and causes a small shift to the clock transition frequency, and as a result changes the VCXO frequency.
b. Change the DDS frequency. This will cause the VCXO to change the frequency in order for the difference 6.8 GHz–5.3 MHz to keep with the clock transition frequency.

A good description of the theory and practice of Atomic Frequency Standard is given in Jacques Vanier and Claude Audoin, "The Quantum Physics of Atomic Frequency Standards", Adam Hilgar, 1989 (2 Volumes).

A high accuracy frequency standard and clock system is described in U.S. Pat. No. 4,899,117 to Vig, hereby incorporated by reference in its entirety. The system employs a microcomputer that compensates for aging and temperature variations in the atomic standard and its slave crystal oscillator and generates an error signal which is used to either correct the frequency of the slave crystal oscillator or to adjust the number of clock pulses per unit time interval.

SUMMARY OF THE INVENTION

The object of the invention is to provide a system that slows down the aging process that occurs in small atomic frequency standard.

To achieve that goal, one utilizes a double system, which comprises of two such atomic standards, device A and device B, and a comparison and a correction circuit. Device A operates all the time and provides the frequency output to the user, while device B is turned on for short time periodically, say once a week. When the device B is off, its aging process is being reduced to a minimum. This is because the temperature of the vapor cell and all inner parts is lower, the atomic vapor and liquid condense to a solid state, and all physical and chemical processes, such as migration, diffusion and reaction, are slowed down substantially. When device B is turned on and let stabilized (for about 1 hour), it retraces (memorized) its original state and original frequency to a great extent. Then, the frequency of the device A is compared and adjusted to match the (unaged) frequency. Thus, the long term aging of device A (and the system output) follows the slowed down aging of device B. Device B may be turned on once a week, once a month, or according to any other appropriate time scheme. The present invention differs significantly from the invention disclosed in U.S. Pat. No. 4,899,117. The latter invention makes use of an external frequency source in order to facilitate calibration of the atomic frequency standard. The present invention employs an internal atomic resonator or atomic frequency standard that is normally frozen, so that it does not age, and is operated only at periodic time intervals (and for enough time to allow for stabilization) for the purposes of calibrating the main, continuously running, atomic standard.

The present invention relates to an atomic frequency standard system having a first small atomic standard, a second small atomic standard, means for comparing the frequency of said first and second atomic standards, and a microprocessor in connection with said means, wherein said first small atomic standard functions regularly and said second small atomic standard is operated at periodic intervals for short time durations only (said short time durations about 1 hour, though they may be more or less as it is appropriate), such that, when said second atomic standard is in operation, said microprocessor functions to calibrate the frequency of said first small atomic standard with respect to said second small atomic standard.

In accordance with preferred embodiments of the present invention, the first and second standards are selected from rubidium or cesium vapor cells.

Moreover in accordance with preferred embodiments of the present invention, said means comprise a mixer and a filter.

Additionally in accordance with preferred embodiments of the present invention, said means comprise a frequency counter.

Further in accordance with preferred embodiments of the present invention, said periodic intervals comprises a week or a month. It is appreciated that other periodic time intervals may be used as well.

Moreover in accordance with preferred embodiments of the present invention, the microprocessor calibrates the frequency of said first small atomic standard by a C-field adjustment.

Additionally in accordance with preferred embodiments of the present invention, the microprocessor calibrates the frequency of said first small atomic standard using a frequency synthesizer.

Further in accordance with preferred embodiments of the present invention, the system hermetically enclosed and sealed under dry atmosphere.

Still further in accordance with preferred embodiments of the present invention, the system is sealed under nitrogen or under a vacuum.

The present invention further relates to an atomic frequency standard comprising a first atomic resonator, a second atomic resonator, a crystal oscillator, and a frequency lock loop including a microprocessor connecting between said first and second atomic resonators and said crystal oscillator for frequency locking the crystal oscillator to said first atomic resonator, wherein said first atomic resonator operates regularly and said second atomic resonator is operated at periodic intervals of short time durations only (said short time durations about 1 hour, though they may be more or less as it is appropriate), such that, when said second atomic standard is in operation, said microprocessor functions to calibrate the frequency of said first small atomic standard with respect to said second atomic resonator.

In accordance with preferred embodiments of the present invention, the standard uses rubidium or cesium vapor cells.

Moreover in accordance with preferred embodiments of the present invention, said periodic intervals comprises a week or a month.

Additionally in accordance with preferred embodiments of the present invention, the microprocessor calibrates the frequency of said first atomic resonator by a C-field adjustment.

Further in accordance with preferred embodiments of the present invention, the microprocessor calibrates the frequency of said first atomic resonator using a frequency synthesizer.

Still further in accordance with preferred embodiments of.the present invention, the standard is hermetically enclosed and sealed under dry atmosphere.

Additionally in accordance with preferred embodiments of the present invention, the standard is sealed under nitrogen or under a vacuum.

BRIEF DESCRIPTION OF THE DRAWINGS

The invention is herein described with reference to the accompanying drawings, wherein.

DETAILED DESCRIPTION OF THE DRAWINGS

The detailed description provided is intended to describe certain preferred embodiments of the present invention. It is in no way intended to limit the scope of the invention, as set out in the claims.

Figure 2:
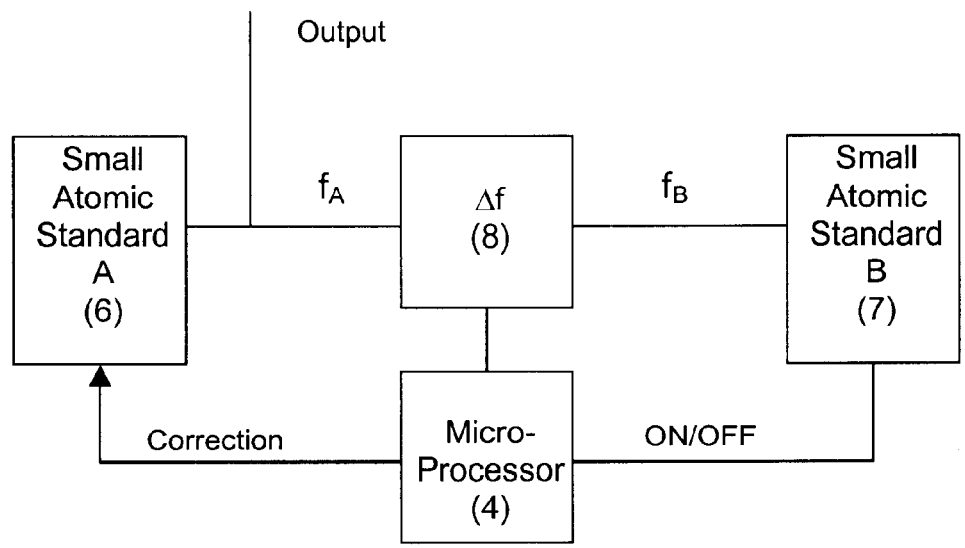
FIG. 2 is a schematic overview of an atomic frequency standard system according to a first preferred embodiment of the present invention.

FIG. 2 is a block diagram of a first possible embodiment of the invention. The system includes two small atomic standards (e.g., cesium or more preferably, rubidium), which are denoted device A (6) and device B (7), means for comparing the frequency between device A and device B, such as a frequency comparator (8) (e.g., a mixer and a filter or a frequency counter), and a microprocessor (4) which includes analog input and output. Device A operates continuously and experiences frequency aging (for example: a Rubidium Standard with an aging of $4\times10^{-11}$/month). Device B is turned on periodically (for example, once a week or once a month), until it stabilizes. After stabilization, the frequency of device B is compared with the frequency of device A by the frequency comparator (8) and the difference is read by the microprocessor (4) which corrects the frequency of device A. The frequency correction can be made via c-field adjustment or via a DDS. Following adjustment, device B is turned off. The total operation time of device B is approximately 55 hours per year for a 1-hour weakly operation, and the aging processes during that time are negligible. The frequency retrace is not accumulative on each turn-on. With a Rubidium Standard it takes 1 hour to retrace the frequency within 1 to $1\times10^{-11}$ to $2\times10^{-11}$ at the same temperature. Therefore, the total change of device B (and of the complete system) is about $2\times10^{-11}$ per week, or per month or per year. This is a significant improvement over a stand-alone Rubidium Frequency Standard.

Note: It is assumed that the frequency vs. Temperature variation is smaller than $2\times10^{-11}$. If greater, then the long-term stability of the system degrades accordingly.

Figure 3:
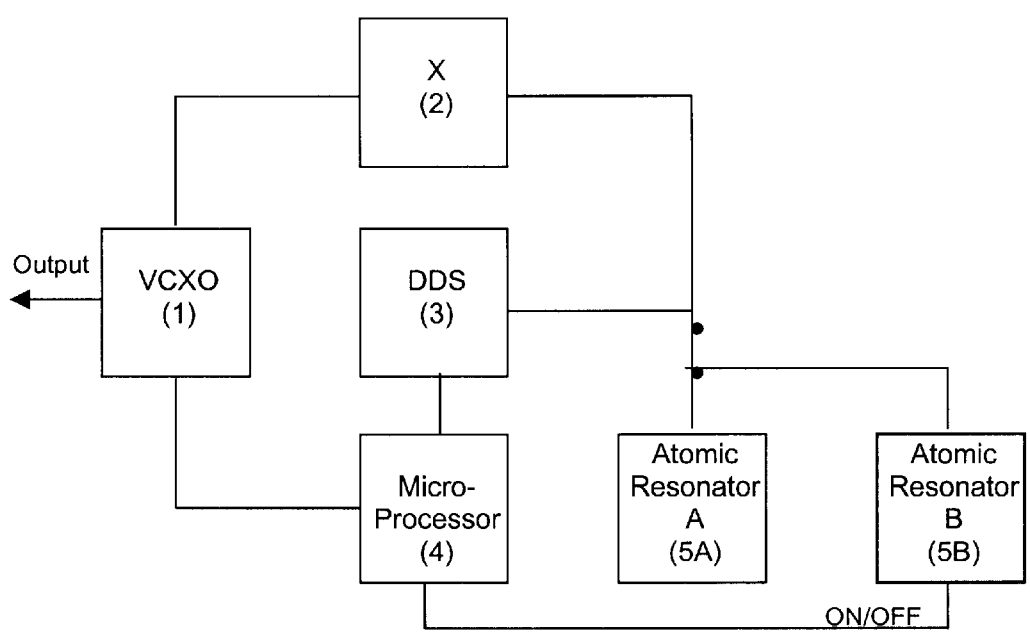
FIG. 3 is a schematic overview of an atomic frequency standard according to a second preferred embodiment of the present invention.

FIG. 3 shows a block diagram of a second possible embodiment of the invention. This embodiment is generally preferred over the first embodiment, because it has fewer components (though certain considerations might favor the embodiment of FIG. 2). Since the frequency is derived from the atomic resonator (in the case of rubidium, "the physics package"), one does not need to duplicate a complete atomic standard, but only the atomic resonator portion. Furthermore, in the embodiment of FIG. 3, there is no need for a frequency comparator, since the atomic resonator serves the function of a frequency discriminator.

Figure 1:
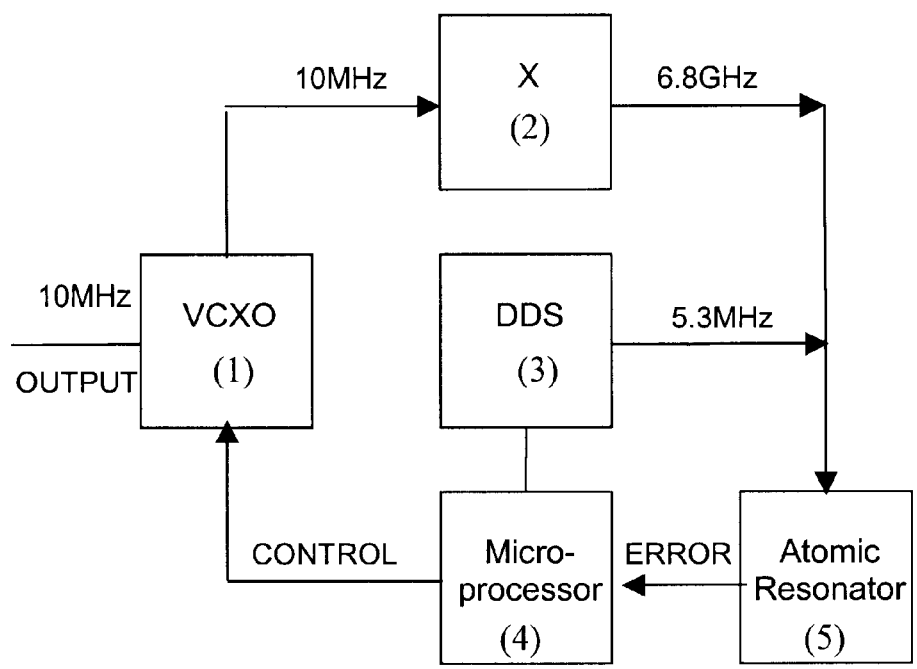
FIG. 1 is a schematic overview of an atomic frequency standard of the prior art.

The system described in FIG. 3 is similar to that of FIG. 1. However, it has an additional atomic resonator that allows for improved long term aging, and it therefore operates in a somewhat more sophisticated manner, as follows:

For most of the time, the VCXO (1) is controlled by a first atomic resonator A (5A) (physics package) and a second atomic resonator B (5B) is off. Once a week (or any other predetermined periodic time interval), resonator B (5B) is turned on and allowed time for stabilization. This normally takes approximately 1 hour, though it may be more or less as well. Then, microprocessor (4) freezes the voltage control to the VCXO (1), and the DDS (3) frequency is adjusted by an amount Df so that the error signal from resonator B (5B) is zero and the frequency input to resonator B (5B) corresponds to it's atomic resonance frequency. Then the microprocessor readjusts the DDS frequency by −2×Df, resumes the frequency-lock-loop operation and locks the VCXO (1) to resonator A (5A) with the shifted DDS (3). As a result, the VCXO frequency matches the clock frequency of resonator A (5A). Then, resonator B (5B) is turned off.

It should be emphasized, however, that these two possible embodiments of the invention are brought as examples and other embodiments are possible to materialize the idea of the invention.

As described above the main contribution to the "aging" origins from physical and chemical processes that occur inside the glass lamp and cells, and these processes are essentially frozen when the unit is turned off. There is, however, also a small contribution to the aging process from processes that occur outside the cell and lamp such as oxidation of metallic surfaces that may reflect light or may change the electrical conductivity in various locations. These changes also may occur when the unit is turned off. In order to improve the performance one may seal under dry atmosphere such as nitrogen, or in a vacuum.

What is claimed is:

1. An atomic frequency standard system having a first small atomic standard, a second small atomic standard, means for comparing the frequency of said first and second atomic standards, and a microprocessor in connection with said means, wherein said first small atomic standard functions regularly and said second small atomic standard is operated at periodic intervals for short durations of time only, such that, when said second atomic standard is in operation, said microprocessor functions to calibrate the frequency of said first small atomic standard with respect to said second small atomic standard.

2. An atomic frequency standard system according to claim 1, wherein the first and second standards are selected from rubidium or cesium.

3. An atomic frequency standard system according to claim 1, wherein said means comprise a mixer and a filter.

4. An atomic frequency standard system according to claim 1, wherein said means comprise a frequency counter.

5. An atomic frequency standard system according to claim 1, wherein said periodic intervals comprise a week or a month.

6. An atomic frequency standard system according to claim 1, wherein the microprocessor calibrates the frequency of said first small atomic standard by a C-field adjustment.

7. An atomic frequency standard system according to claim 1, wherein the microprocessor calibrates the frequency of said first small atomic standard using a frequency synthesizer.

8. An atomic frequency standard system according to claim 1, wherein the system hermetically enclosed and sealed under dry atmosphere.

9. An atomic frequency standard system according to claim 8, wherein the system is sealed under nitrogen or under a vacuum.

10. An atomic frequency standard comprising a first atomic resonator, a second atomic resonator, a crystal oscillator, and a frequency lock loop including a microprocessor connecting between said first and second atomic resonators and said crystal oscillator for frequency locking the crystal oscillator to said first atomic resonator, wherein said first atomic resonator operates regularly and said second atomic resonator is operated at periodic intervals for short time durations only, such that, when said second atomic resonator is in operation, said microprocessor functions to calibrate the frequency of said first atomic resonator with respect to said second atomic resonator.

11. An atomic frequency standard according to claim 10 using rubidium or cesium.

12. An atomic frequency standard according to claim 10, wherein said periodic interval comprises a week or a month.

13. An atomic frequency standard according to claim 10, wherein the microprocessor calibrates the frequency of said first atomic resonator by a C-field adjustment.

14. An atomic frequency standard according to claim 10, wherein the microprocessor calibrates the frequency of said first atomic resonator using a frequency synthesizer.

15. An atomic frequency standard according to claim 10, wherein the standard is hermetically enclosed and sealed under dry atmosphere.

16. An atomic frequency standard according to claim 10, wherein the standard is sealed under nitrogen or under a vacuum.

* * * * *